United States Patent
LeGros et al.

(10) Patent No.: US 11,134,585 B2
(45) Date of Patent: Sep. 28, 2021

(54) AIRCRAFT POWER ELECTRONIC UNIT AND METHOD OF COOLING

(71) Applicant: Hamilton Sundstrand Corporation, Charlotte, NC (US)

(72) Inventors: Craig R. LeGros, Rockford, IL (US); Tom A. Utecht, Cherry Valley, IL (US); Debabrata Pal, Hoffman Estates, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/428,765

(22) Filed: May 31, 2019

(65) Prior Publication Data

US 2020/0383233 A1    Dec. 3, 2020

(51) Int. Cl.
*H05K 7/20* (2006.01)
*B64D 27/24* (2006.01)
*B64D 33/08* (2006.01)

(52) U.S. Cl.
CPC ......... *H05K 7/20154* (2013.01); *B64D 27/24* (2013.01); *B64D 33/08* (2013.01); *H05K 7/20172* (2013.01); *H05K 7/20854* (2013.01); *H05K 7/20863* (2013.01); *H05K 7/20909* (2013.01)

(58) Field of Classification Search
None
See application file for complete search history.

(56) References Cited

U.S. PATENT DOCUMENTS

| | | | |
|---|---|---|---|
| 4,608,819 A * | 9/1986 | Colman | F02C 9/00 60/39.83 |
| 8,593,808 B2 * | 11/2013 | Pal | H05K 7/20163 361/695 |
| 8,686,589 B2 | 4/2014 | Pereira | |
| 9,826,575 B2 | 11/2017 | Willmot et al. | |
| 2011/0148235 A1 * | 6/2011 | Lemmers, Jr. | H02K 7/108 310/83 |
| 2013/0175019 A1 * | 7/2013 | Phelan | H01L 23/427 165/185 |
| 2014/0332182 A1 * | 11/2014 | Taras | H01L 23/44 165/80.3 |
| 2016/0137305 A1 * | 5/2016 | Joubert | F04D 25/08 417/423.1 |
| 2017/0170763 A1 * | 6/2017 | Blackwelder | H02P 5/74 |
| 2017/0284298 A1 | 10/2017 | Suciu et al. | |
| 2019/0010866 A1 * | 1/2019 | Snyder | B64D 27/10 |
| 2019/0014687 A1 | 1/2019 | Snyder | |
| 2019/0040795 A1 | 2/2019 | Regnard et al. | |

FOREIGN PATENT DOCUMENTS

EP    1898069 A2    3/2008

OTHER PUBLICATIONS

Extended European search report issued in corresponding EP application No. 19212464.2, dated Jul. 1, 2020.

* cited by examiner

*Primary Examiner* — Mukundbhai G Patel
(74) *Attorney, Agent, or Firm* — Locke Lord LLP; Scott D. Wofsy; Georgi Korobanov

(57) ABSTRACT

An electrical power unit cooling system including at least one cooling fin configured to be thermally connected to a bus housing of the electrical power unit, the bus housing being configured to be attached to a surface of an aircraft fan housing such that the at least one cooling fin protrudes through the fan housing in order to be cooled by air flow within the fan housing.

16 Claims, 2 Drawing Sheets

AIRCRAFT POWER ELECTRONIC UNIT AND METHOD OF COOLING

BACKGROUND

Technological Field

The present disclosure relates to cooling electrical components, and more particularly to cooling aircraft rectifiers using turbo fan flow.

Description of Related Art

Electrical power conversion system in modern aircraft using a variety of electronic equipment create and dissipate a large amount of heat. High power loss electrical system equipment, such as power electronics and rectifier units, within HVDC systems create significant weight increases and complexity. A variety of devices and system arrangements are known and used in the art to cool the systems and electronics, primarily using oil as a coolant.

The conventional methods and systems have generally been considered satisfactory for their intended purpose. However, there is still a need in the art for electronics cooling having improved performance and decreased weight of the system. There also remains a need in the art for such systems and components that are economically viable. The present disclosure may provide a solution for at least one of these remaining challenges.

SUMMARY OF THE INVENTION

An electrical power unit cooling system including at least one cooling fin configured to be thermally connected to a bus housing of the electrical power unit, the bus housing being configured to be attached to a surface of an aircraft fan housing such that the at least one cooling fin protrudes through the fan housing in order to be cooled by air flow within the fan housing.

The fins of the series of fins can be spaced apart based on a thickness of the fins, wherein a gap between each adjacent fin of the series of fins can be between 1 and 5 times the thickness of the fins and a ratio of the height of the fins to the width of the fins can be between 10 and 40, inclusive.

A base plate can secure the bus housing to the first surface of the aircraft fan housing.

The fan generated air flow can include fan bypass flow and the bus housing can be sealed from bypass flow. The first surface of the aircraft fan housing can be an outer surface of the fan housing. The rectifier unit can be electrically connected to a DC bus located within an avionics bay of the aircraft and the rectifier unit can be electrically connected to a generator located within the nacelle of the aircraft. A second rectifier unit can be electrically connected to a second generator. The first generator can be a starter generator power rated to at least 150 kVa. The rectifier unit can include a three-phase alternating current input, and a direct current output and the rectifier can process at least 540 volts.

The at least one cooling fin is attached to the bus housing by brazing, swaging, welding or additive manufacturing and can be part of the electrical power conversion system of an aircraft.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION

Figure 1:
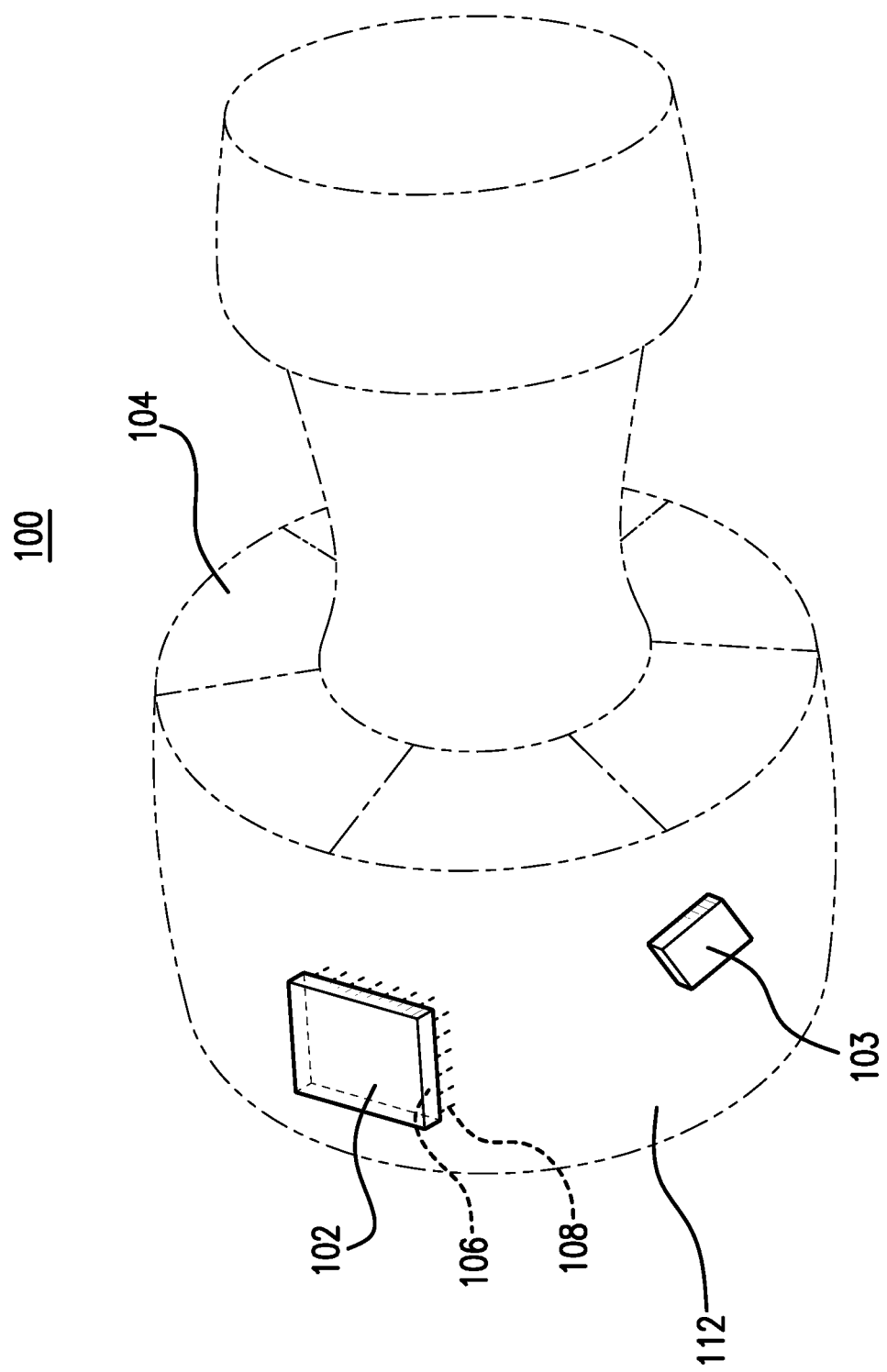
FIG. 1 is a perspective view of an aircraft nacelle showing a rectifier unit.

Reference will now be made to the drawings wherein like reference numerals identify similar structural features or aspects of the subject disclosure. For purposes of explanation and illustration, and not limitation, a partial view of an exemplary embodiment of a rectifier unit in accordance with the disclosure is shown in FIG. 1 and is designated generally by reference character 100. Other embodiments of the rectifier unit in accordance with the disclosure, or aspects thereof, are provided in FIG. 2, as will be described. The methods and systems of the disclosure can be used to improve cooling of the rectifier and reduce weight of the overall system.

Referring to FIG. 1, a rectifier 102 of an electrical power conversion system 100 is shown attached to a fan housing 104. The rectifier unit 102 is configured to convert alternating current to direct current in order to distribute the current between to other systems. The rectifier unit 102 includes a bus housing 106, and at least one cooling fin 108 thermally connected to the bus housing 106 configured to cool to the bus housing 106. The bus housing 106 is attached to a first surface 112 of the aircraft fan housing 104 and the at least one cooling fin 108 protrudes through the fan housing 104 in order to be cooled by fan generated air flow. The fan generated air flow includes fan bypass flow. The first surface 112 of the aircraft fan housing is an outer surface of the fan housing 104. The rectifier unit 102 is electrically connected to a DC bus (not shown) located within an avionics bay of the aircraft and the rectifier unit 102 is also electrically connected to a generator located within the nacelle of the aircraft. The rectifier unit includes a three-phase alternating current input, and a direct current output, able to process at least 540 volts. The generator is a starter generator, power rated to at least 150 kVa. A second rectifier unit 103 can be placed on the outer surface 112 of the fan housing electrically and be electrically connected to a second generator.

Figure 2:
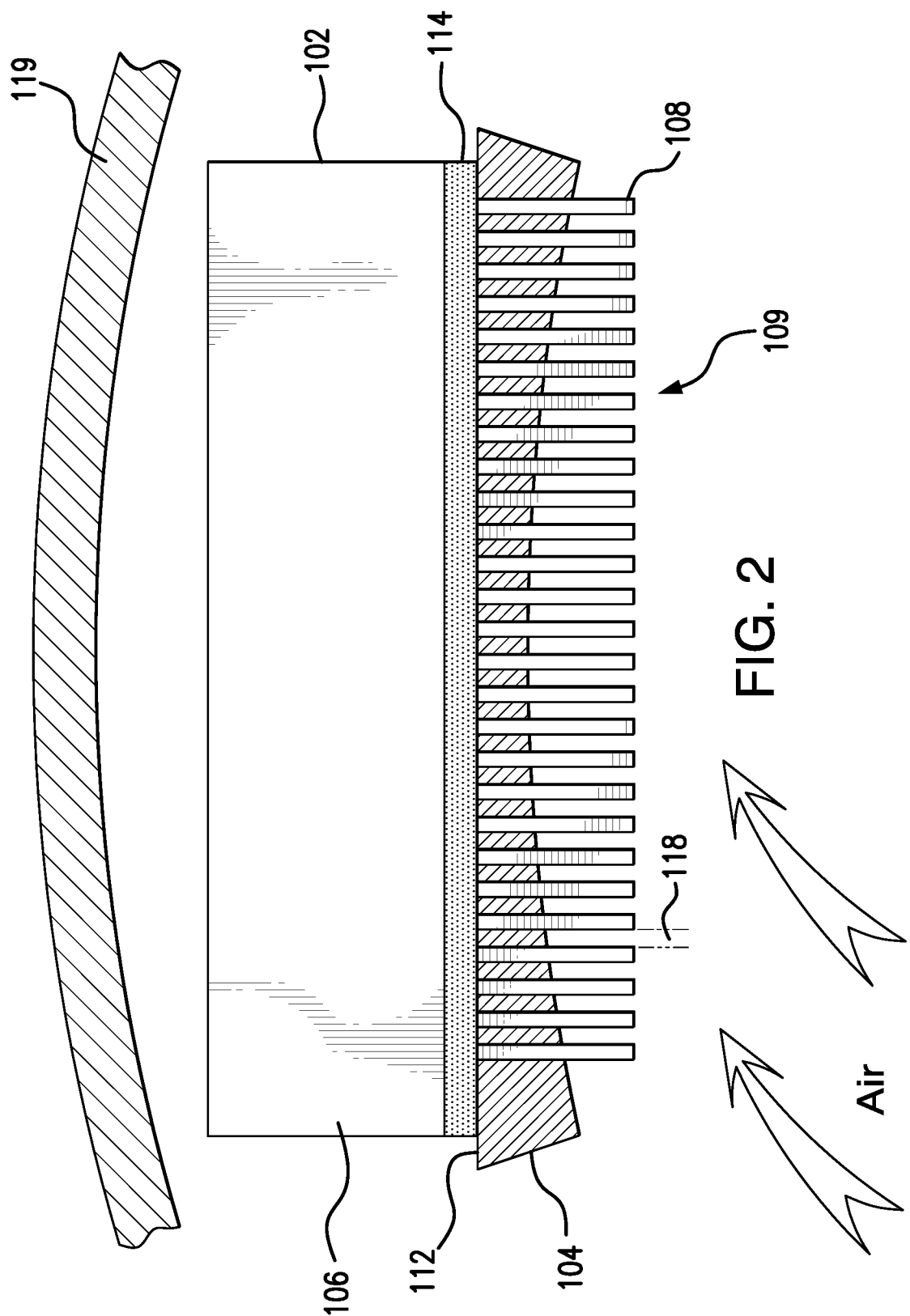
FIG. 2 is a side view of the rectifier unit of FIG. 1, showing the cooling fins.

Referring to FIG. 2, in order to show the details of the rectifier unit 102, the at least one cooling fin 108 includes a series of cooling fins 109. The cooling fin 108 or series of fins 109 are mechanically and thermally attached to the bus housing 106. The fins 108 are spaced apart based on a thickness of the fins 108, wherein a gap 118 between each adjacent fin of the series of fins is between 1 and 5 times the thickness of the fins, and a ratio of the height of the fins 109 to the width of the fins 109 is between 10 and 40. This spacing allows for proper amount of fins to be placed and the rectifier unit, and provide the required amount of heat transfer between the bypass air and the bus housing. A base plate 114 secures the bus housing 106 to the first surface 112 of the aircraft fan housing 104. The bus housing 106 is sealed from bypass flow, and is in turn protected from any debris. The housing 106 benefits from being placed in a less harsh environment than the cooling fins 109 and being covered by the nacelle cover 119.

A method of cooling an electrical power unit is also conceived. The method includes flowing aircraft fan generated bypass air over a fin attached to a body of the electrical power unit, wherein the fin is at least partially positioned within a fan housing, and the body is completely positioned outside of the fan housing.

The methods and systems of the present disclosure, as described above and shown in the drawings, provide for cooling of an electronic system with superior properties including increased reliability and stability, and reduced size, weight, complexity, and/or cost. While the apparatus and methods of the subject disclosure have been showing and described with reference to embodiments, those skilled in the art will readily appreciate that changes and/or modifications may be made thereto without departing from the spirit and score of the subject disclosure.

What is claimed is:

1. An electrical power unit cooling system comprising:
a plurality of cooling fins thermally connected and coupled to a housing of the electrical power unit, the electrical power unit housing attached to an outer surface of an aircraft fan housing such that each of the cooling fins pierces through and protrudes into an internal portion of the fan housing in order to be cooled by air flow within the fan housing, and wherein the fins of the series of fins are circumferentially spaced apart based on a thickness of the fins, wherein a gap between each adjacent fin of the series of fins is between 1 and 5 times the thickness of the fins, inclusive and a ratio of the height of the fins to the width of the fins is between 10 and 40, inclusive.

2. The system of claim 1, wherein a base plate secures the electrical power unit housing to the outer surface of the aircraft fan housing.

3. The system of claim 1, wherein the air flow includes fan generated bypass flow.

4. The system of claim 3, wherein the electrical power unit housing is sealed from the bypass flow.

5. The system of claim 1, wherein the electrical power unit is electrically connected to a DC bus located within an avionics bay of the aircraft.

6. The system of claim 1, wherein the electrical power unit is electrically connected to a generator located within the nacelle of the aircraft.

7. The system of claim 6, including a second electrical power unit electrically connected to a second generator.

8. The system of claim 6, wherein the generator is a starter generator.

9. The system of claim 6, wherein the generator is power rated to at least 150 kVa.

10. The system of claim 1, wherein the at least one cooling fin is attached to the electrical power unit housing by brazing, swaging, welding or additive manufacturing.

11. The system of claim 1, wherein the electrical power unit includes a three-phase alternating current input, and a direct current output.

12. The system of claim 1, wherein the rectifier is able to process at least 540 volts.

13. The system of claim 1, wherein the system is part of the electrical power conversion system of an aircraft.

14. The system of claim 1, wherein the rectifier is configured to convert alternating current to direct current.

15. A method of cooling an electrical power unit comprising:
inserting a plurality of cooling fins through an outer surface of an aircraft fan housing such that each of the cooling fins pierces through and protrudes into an internal portion of the fan housing, wherein a ratio of the height of the fins to the width of the fins is between 10 and 40, inclusive;
spacing each of the cooling fins circumferentially apart based on a thickness of the fins, wherein a gap between each adjacent fin of the series of fins is between 1 and 5 times the thickness of the fins; and
flowing air over a fin attached to a body of the electrical power unit, wherein the fin is at least partially positioned within the fan housing.

16. The method of claim 15, wherein the flowing includes aircraft fan generated bypass air flow.

\* \* \* \* \*